(12) United States Patent
Kumada et al.

(10) Patent No.: US 10,529,464 B2
(45) Date of Patent: Jan. 7, 2020

(54) SHIELD SLEEVE

(71) Applicant: Yazaki Corporation, Tokyo (JP)

(72) Inventors: Taketo Kumada, Shizuoka (JP); Hiroki Kondo, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/866,607

(22) Filed: Jan. 10, 2018

(65) Prior Publication Data

US 2018/0158568 A1   Jun. 7, 2018

Related U.S. Application Data

(63) Continuation of application No. 13/968,798, filed on Aug. 16, 2013, now abandoned, which is a continuation of application No. PCT/JP2012/053888, filed on Feb. 17, 2012.

(30) Foreign Application Priority Data

Feb. 17, 2011  (JP) .................................. 2011-031796
Feb. 17, 2012  (JP) .................................. 2012-033188

(51) Int. Cl.
  *H01B 7/17* (2006.01)
  *H05K 9/00* (2006.01)
  *H02G 3/04* (2006.01)
(52) U.S. Cl.
  CPC ............. *H01B 7/17* (2013.01); *H02G 3/0481* (2013.01); *H05K 9/0098* (2013.01)

(58) Field of Classification Search
  None
  See application file for complete search history.

(56) References Cited

U.S. PATENT DOCUMENTS

| 4,822,950 A | 4/1989 | Schmidt |
| 4,920,234 A | 4/1990 | Lemke |
| 5,064,704 A | 11/1991 | Stewart |
| 5,189,375 A | 2/1993 | Tuttle |
| 5,473,113 A | 12/1995 | Aldissi |
| 5,475,185 A | 12/1995 | Tokarsky |

(Continued)

FOREIGN PATENT DOCUMENTS

| JP | 1-86297 U | 6/1989 |
| JP | 2000-512690 A | 9/2000 |

(Continued)

OTHER PUBLICATIONS

Communication dated Oct. 20, 2016 issued by Japanese Intellectual Property Office in counterpart Japanese Patent Application No. 2016-014593.

(Continued)

*Primary Examiner* — Nathan T Leong
(74) *Attorney, Agent, or Firm* — Sughrue Mion, PLLC (57) ABSTRACT

A shield sleeve for shielding an electric wire includes a tensile strength fiber that has an approximately circular section and on which a metal-plating layer is formed. A plurality of the tensile strength fibers is braided to form a tubular shape. Braid density of the braided tensile strength fibers is 85% or more and 98% or less and resistance between the braided tensile strength fibers is 0.096 Ω/m or less.

1 Claim, 5 Drawing Sheets

(56) References Cited

U.S. PATENT DOCUMENTS

| | | |
|---|---|---|
| 5,796,042 A | 8/1998 | Pope |
| 5,935,706 A * | 8/1999 | Hoover ............... C23C 18/1644 |
| | | 428/375 |
| 6,045,680 A | 4/2000 | Cawston et al. |
| 6,194,666 B1 | 2/2001 | Hayashida |
| 6,525,271 B2 | 2/2003 | Groegl et al. |
| 2002/0151950 A1 | 10/2002 | Okuzumi |
| 2008/0045617 A1 * | 2/2008 | Goto ....................... C08J 11/16 |
| | | 521/40.5 |
| 2008/0314636 A1 | 12/2008 | Ogura |
| 2010/0038112 A1 | 2/2010 | Grether |
| 2010/0236810 A1 | 9/2010 | Mukai |

FOREIGN PATENT DOCUMENTS

| | | |
|---|---|---|
| JP | 2006-164754 A | 6/2006 |
| JP | 2006-164830 A | 6/2006 |
| JP | 2007-5233 A | 1/2007 |
| JP | 2007-299933 A | 11/2007 |
| JP | 2009-4115 A | 1/2009 |
| JP | 2010-40396 A | 2/2010 |
| JP | 2010-140757 A | 6/2010 |
| JP | 2011-29155 A | 2/2011 |

OTHER PUBLICATIONS

Communication dated Mar. 14, 2017, issued by the Japanese Patent Office in counterpart Japanese Patent Application No. 2012-33188.
Office Action dated Jul. 5, 2016 issued by the Japanese Patent Office in counterpart Japanese Patent Application No. 2012033188.
Office action dated Mar. 29, 2016, issued by the Japanese Patent Office in counterpart Japanese Patent Application No. 2012-033188.
Search Report dated Apr. 17, 2012 issued in International Application No. PCT/JP2012/053888 (PCT/ISA/210).
Written Opinion dated Apr. 17, 2012 issued in International Application No. PCT/JP2012/053888 (PCT/ISA/237).

* cited by examiner

SHIELD SLEEVE

CROSS REFERENCE TO RELATED APPLICATION

This application is a continuation of U.S. application Ser. No. 13/968,798, filed on Aug. 16, 2013, which is a continuation of PCT application No. PCT/JP2012/053888, which was filed on Feb. 17, 2012 based on Japanese Patent Application Nos. 2011-031796 filed on Feb. 17, 2011, and 2012-033188 filed on Feb. 17, 2012, the contents of which are incorporated herein by reference.

1. TECHNICAL FIELD

The present invention relates to a shield sleeve.

2. BACKGROUND ART

In recent years, development for a shield sleeve with a high shielding property has been required for the purpose of preventing noise from the outside and noise emissions from an electric wire. Further, in an electric wire used at a site having a movable portion, such as a robot, it is necessary for a shield sleeve to have a high flexibility and high wear resistance.

Therefore, a shield sleeve has been suggested, which is configured by wrapping a metallic foil around a surface of a yarn and performing a braiding processing (for example, see PTL1). Further, a shield sleeve has been also suggested, which is configured by performing a braiding processing on conductive strands such as annealed copper wires and fibers such as non-conductive aramid (for example, see PTL2).

CITATION LIST

Patent Document

PTL1: JP-UM-A-1-086297
PTL2: JP-A-2006-164830

SUMMARY OF THE INVENTION

However, in the shield sleeve disclosed in PTL1, since the metallic foil is wrapped around the surface of the yarn, there is a tendency to increase in thickness. Further, since an edge portion of the metallic foil is interfered with the yarn depending on the flexion situation of the shield sleeve and therefore the yarn may be broken or cracking or breaking may occur in the metallic foil, there is a possibility that conductance resistance of the shield sleeve is increased and therefore the shielding property is decreased.

Further, in the shield sleeve disclosed in PTL2, since aramid fibers are used in a part of the shield sleeve, the shielding property is decreased. Furthermore, in the technology disclosed in PTL2, since the annealed copper wire is used in the shield sleeve, effect of weight reduction is poor.

The present invention has been made to solve such conventional problems and an object thereof is to provide a shield sleeve which is capable of obtaining an excellent wear resistance and bending resistance.

(1) According to an aspect of the invention, a shield sleeve for shielding an electric wire includes a tensile strength fiber that has an approximately circular section and on which a metal-plating layer is formed. A plurality of the tensile strength fibers is braided to form a tubular shape.

(5) According to another aspect of the invention, a shield sleeve for shielding an electric wire includes a tensile strength fiber bundle that includes a plurality of tensile strength fibers having an approximately circular section and on which a metal-plating layer is formed. A plurality of the tensile strength fiber bundles is braided to form a tubular shape.

According to the shield sleeve of the present invention (1) or (5), since the contact surface between the fibers and the plating layer is smooth, it is possible to suppress the occurrence of cracks and it is possible to prevent the bundles of braid from rubbing each other in flexing. Accordingly, it is possible to provide a shield sleeve which is capable of obtaining an excellent wear resistance and bending resistance.

Further, according to the shield sleeve of the present invention, the wear resistance and bending resistance are excellent since the tensile strength fibers subjected to metal plating are used and also it is possible to contribute to the weight reduction since light material called yarn is used. In addition, since the shield sleeve does not employ a configuration in which the metallic foil is wrapped around the surface of the yarn, the thickness thereof is not increased than necessary.

(2) In the shield sleeve of (1), braid density of the braided tensile strength fibers is 85% or more and 98% or less and resistance between the braided tensile strength fibers is 0.096 Ω/m or less.

(6) In the shield sleeve of (5), braid density of the braided tensile strength fiber bundles is 85% or more and 98% or less and resistance between the braided tensile strength fiber bundles is 0.096 Ω/m or less.

According to the shield sleeve of the present invention (2) or (6), the wear resistance and bending resistance are excellent since the tensile strength fibers subjected to metal plating are used and also it is possible to contribute to the weight reduction since light material called yarn is used. In addition, since the shield sleeve does not employ a configuration in which the metallic foil is wrapped around the surface of the yarn, the thickness thereof is not increased than necessary. Furthermore, since the braid density of braid is 85% or more and the resistance between the braids is 0.096 Ω/m or less, it is possible to secure a shielding effect equal to or more than a conventional shield sleeve generally used, by an absorbing clamp method. In addition, since the braid density of braid is 98% or less, it is possible to provide a shield sleeve having an excellent bending resistance. Accordingly, it is possible to provide a shield sleeve which is capable of obtaining the diameter reduction and high shielding effects while maintaining a high flexibility and high wear resistance.

(3) In the shield sleeve of (1) or (2), wherein the braided tensile strength fibers has a multi-layer construction in a radial direction of the electric wire.

(7) In the shield sleeve of (5) or (6), wherein the braided tensile strength fiber bundles form a multi-layer construction in a radial direction of the electric wire.

According to this shield sleeve (3) or (7), since the shield sleeve is multi-layered in the radial direction of the electric wire, it is possible to further improve the wear resistance and shielding effects.

According to the present invention, it is possible to provide a shield sleeve capable of obtaining an excellent wear resistance and bending resistance.

BRIEF DESCRIPTION OF DRAWINGS

FIG. 1A and FIG. 1B are configuration diagrams showing a shield sleeve according to an illustrative embodiment of the present invention.

FIG. 2A to FIG. 2C are configuration diagrams showing a case where metal plating is performed on one tensile strength fiber or a bundle of a plurality of tensile strength fibers.

DESCRIPTION OF EMBODIMENTS

Figure 1A:
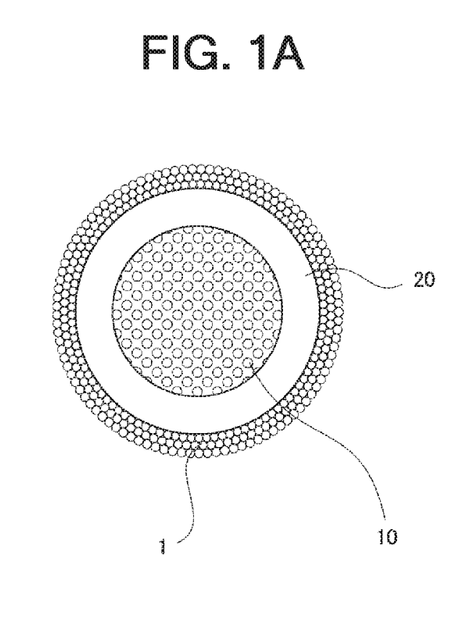
FIG. 1A is a radial cross-sectional view thereof and FIG. 1B is a side view thereof.
Figure 1B:
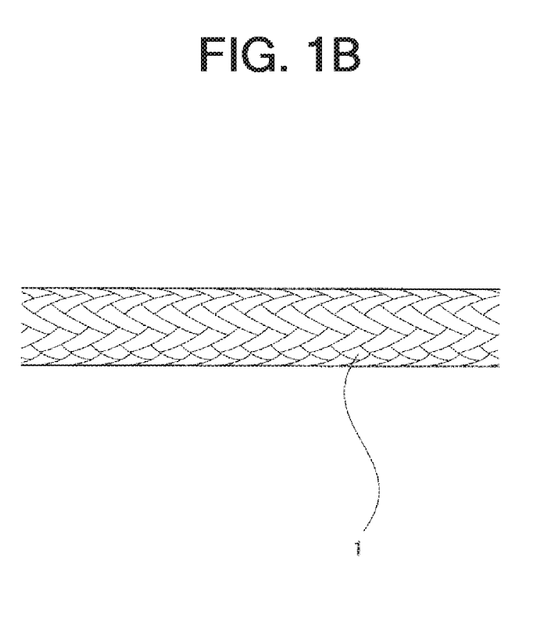

Hereinafter, preferred embodiments of the present invention will be described with reference to the drawings. FIG. 1A and FIG. 1B are configuration diagrams showing a shield sleeve according to an illustrative embodiment of the present invention, FIG. 1A is a radial cross-sectional view thereof and FIG. 1B is a side view thereof. A shield sleeve 1 shown in FIG. 1 is provided on an outer periphery of an insulator 20 coated on a conductor 10.

As the conductor 10, an annealed copper wire, a silver-plated annealed copper wire, a tin-plated annealed copper wire and a tin-plated copper alloy wire, etc., can be used, for example. Although one conductor 10 is provided in the present embodiment, a plurality of conductors may be provided. Further, a diameter or the like of the conductor 10 is appropriately set depending on the specification. The insulator 20 is a member coated on the conductor 10 and configured by a non-conductive member.

The shield sleeve 1 is configured by performing a metal-plating on one tensile strength fiber having an approximately circular section or a bundle of a plurality of tensile strength fibers having an approximately circular section and performing a braiding processing. Here, as the tensile strength fiber, para-aramid fiber, PBO (poly (p-phenylenebenzobisoxazole)) fiber and polyarylate fiber can be included, for example.

As such, since the tensile strength fiber subjected to metal plating is used in the present embodiment, a wear resistance and bending resistance are excellent.

Next, a method for manufacturing the shield sleeve 1 according to the present embodiment will be described. Schematically, first, a plating processing is performed on one tensile strength fiber 30 or a bundle of a plurality of tensile strength fibers 30 having an approximately circular section. Then, a braiding processing is performed on the fiber(s) subjected to the plating processing. In this way, the shield sleeve 1 according to the present embodiment can be obtained. Here, the braining method is optional.

In the below, a method of the plating processing is further described. With respect to the plating processing, the present applicant has suggested a plating pretreatment method which is capable of suppressing uneven plating (JP-A-2011-002736). In the below, a plating processing using this plating pretreatment method will be described.

First, oil agent is applied on the tensile strength fiber 30. Here, the oil agent to be applied is hardly-soluble for supercritical carbon dioxide and can dissolve and reduce the organo-metallic complex. Specifically, the oil agent to be applied includes fatty acid oil agent, paraffin oil, etc.

Then, the tensile strength fiber 30 having the oil agent applied thereon is accommodated in a case into which the organo-metallic complex is charged and carbon dioxide in a supercritical state is supplied into the case. In this way, the organo-metallic complex is dissolved and then reduced in the oil agent through the supercritical carbon dioxide, so that the organo-metallic complex is decomposed and therefore metal is precipitated on the fiber. Particularly, since the supercritical carbon dioxide has high solubility and diffusivity, the complex can be uniformly dissolved in the oil agent even when a large amount of tensile strength fibers 30 are accommodated in the case.

Next, after a predetermined time has lapsed, the tensile strength fiber 30 is taken out from the case. Then, the oil agent is removed. At this time, heat treatment is performed for about 60 minutes at 200° C., for example. In this way, the oil agent is removed and metal remains on the tensile strength fiber 30.

Thereafter, an electroless copper plating processing is performed. By doing so, a metal plating 40 is formed on the tensile strength fiber 30.

By the way, as a conventional method for plating fiber, it is general that fiber is processed in advance into a star-shaped section and thus irregularities are formed on a surface of a plating layer in order to facilitate plating on the fiber. However, in the plating layer formed by this method, since irregularities are provided on the surface of the plating layer, there is a problem that stress concentration is likely to occur and cracks are easy to grow. Further, in a case where the fiber plated by this method is subjected to a braiding processing and then bent, since the bundles of braid are adapted to rub each other, there is a problem that cracks are easy to grow. Furthermore, in a case where plating is performed on the fiber other than the tensile strength fiber, since the elongation of the fiber is larger than the elongation of the plating in flexion, there is a problem that cracks are likely to occur in the plating layer.

On the contrary, according to the manufacturing method, the shield sleeve 1 is obtained by performing a metal-plating on the tensile strength fiber having an approximately circular section and performing a braiding processing. Since the shield sleeve 1 has a configuration that a plating layer is applied circumferentially to the fiber having a circular section, the contact surface between the fiber and the plating layer is smooth. Therefore, it is possible to suppress the occurrence of cracks, thereby obtaining an excellent bending resistance. In addition, it is possible to prevent the bundles of braid from rubbing each other in flexing, thereby obtaining an excellent wear resistance.

Figure 5:
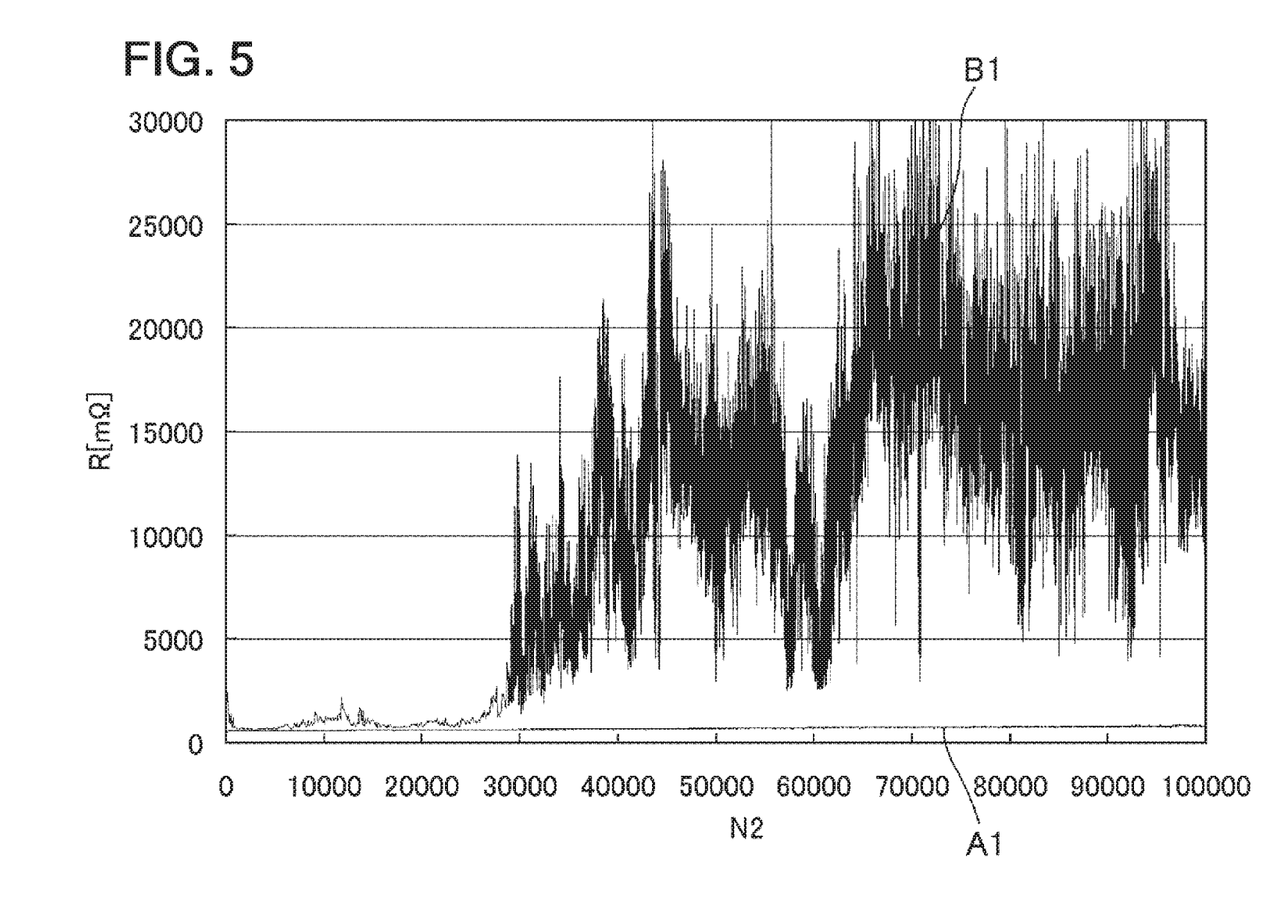
FIG. 5 is a graph showing a bending resistance of the shield sleeve.

FIG. 5 is a graph showing a bending resistance of the shield sleeve 1. In the measurements of FIG. 5, the shield sleeve 1 is provided along a guide of R20, a load of 400 g is applied, a distance between a fixed side and a moving side is set as 40 mm, a stroke is set as 100 mm and a cycle rate is set as 100 times/min. In an embodiment shown in FIG. 5, the horizontal axis represents the sliding bending times N2 and the vertical axis represents the resistance R[mΩ] between the braids.

Example 1 indicated by a reference numeral A1 in the embodiment shown in FIG. 5 refers to the shield sleeve 1 that is obtained by bundling polyarylate fiber (440 dtex) having an approximately circular section, on which tin and copper are plated at a predetermined thickness and performing a braiding processing using twenty-four bundles.

Comparative Example 1 indicated by a reference numeral B1 in the embodiment shown in FIG. 5 refers to a tin-plated copper foil wrapping glass fiber sleeve in which tin-plated copper foil is wrapped around the glass fiber in a spiral type.

As is apparent from FIG. 5, in this measurement, the value of the resistance R between the braids in the example 1 is hardly changed even when the sliding bending times N2 is increased. On the contrary, in Comparative Example 1, the value of the resistance R between the braids starts to increase after the sliding bending times N2 exceeds 1000 times, the value of the resistance R between the braids is rapidly increased when the sliding bending times N2 approaches 3000 times and thereafter, the value of the resistance R between the braids still represents a high value.

From the above descriptions, it can be seen that the example 1 according to the present embodiment has a bending resistance superior to Comparative Example 1 using the metallic foil.

Figure 2A:
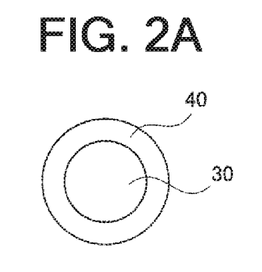
FIG. 2A shows an example where the metal plating is performed on one tensile strength fiber.
Figure 2B:
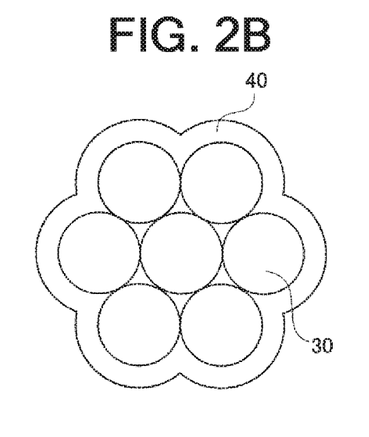
FIG. 2B shows a first example where the metal plating is performed on a bundle of a plurality of tensile strength fibers and FIG. 2C is a second example where the metal plating is performed on a bundle of a plurality of tensile strength fibers.
Figure 2C:
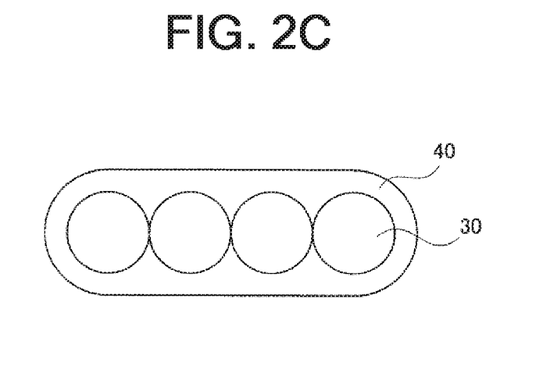

FIG. 2A to FIG. 2C are configuration diagrams showing a case where metal plating is performed on one tensile strength fiber or a bundle of a plurality of tensile strength fibers having an approximately circular section, FIG. 2A shows an example where the metal plating is performed on one tensile strength fiber, FIG. 2B shows a first example where the metal plating is performed on a bundle of a plurality of tensile strength fibers and FIG. 2C is a second example where the metal plating is performed on a bundle of a plurality of tensile strength fibers.

In a case where the metal plating 40 is applied to one tensile strength fiber 30, as shown in FIG. 2A, an outer periphery of the tensile strength fiber 30 is covered with the metal plating 40. Here, the metal plating 40 to be applied is tin or copper. On the other hand, in a case where the metal plating 40 is applied to a bundle of a plurality of tensile strength fibers 30, as shown in FIG. 2B, the metal plating 40 is collectively applied to the bundle of a plurality of tensile strength fibers 30. Further, also in a case where the metal plating is applied to the plurality of tensile strength fibers 30 in a state of being arranged on a plane, as shown in FIG. 2C, the metal plating 40 is applied collectively.

In a case where the metal plating 40 is collectively applied to the bundle of a plurality of tensile strength fibers 30 as shown in FIG. 2B, the tensile strength fibers 30 subjected to the metal plating 40 are overlapped and multilayered. Specifically, in a case where the tensile strength fibers are subjected to a braiding processing and used as the shield sleeve 1, the tensile strength fibers 30 subjected to the metal plating 40 are overlapped and multilayered in a radial direction of an electric wire. When the tensile strength fibers are multilayered in the above way, a shielding effect is increased and a wear resistance is also improved, as compared to a case of a single layer.

Further, in the shield sleeve 1, braid density of braid is 85% or more and 98% or less and resistance between the braids is 0.096 Ω/m or less. Here, when, in the shield sleeve 1, the braid density of braid is 85% or more and the resistance between the braids is 0.096 Ω/m or less, it is possible to secure a shielding effect equal to or more than a conventional shield sleeve generally used, by an absorbing clamp method.

Figure 3:
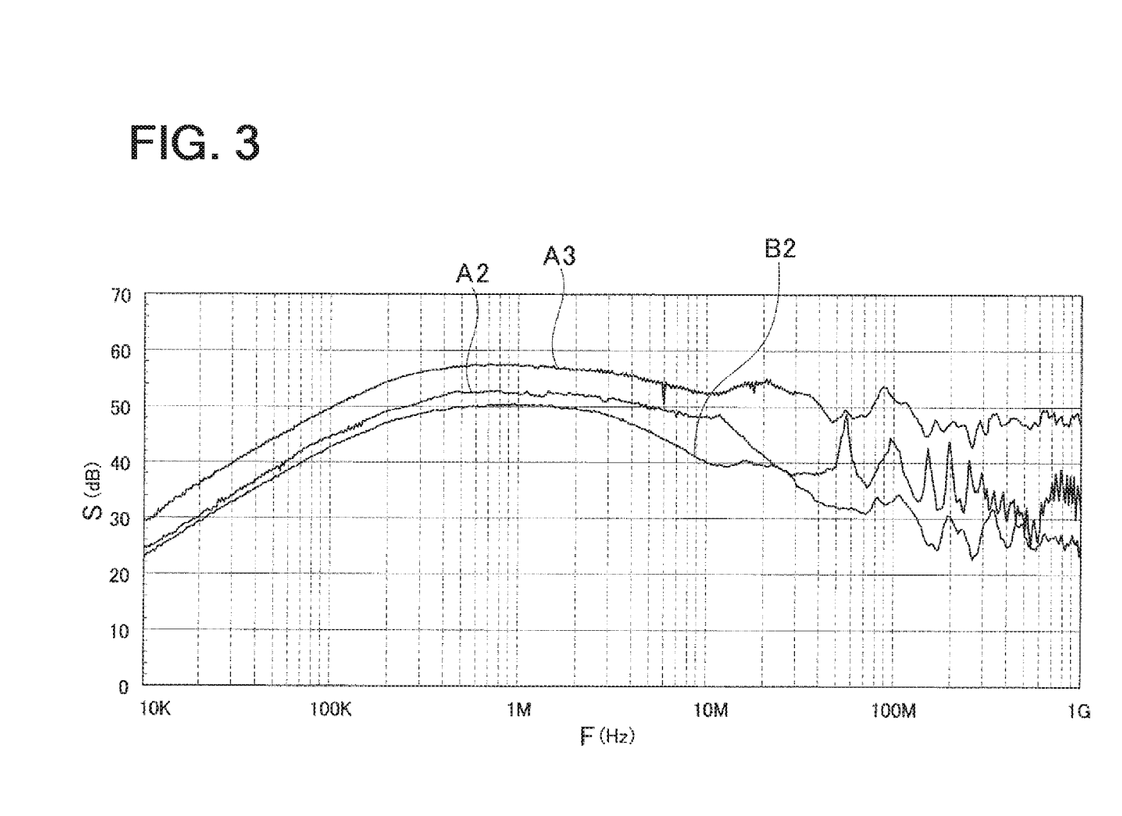
FIG. 3 is a graph showing the characteristics of the shield sleeve.

FIG. 3 is a graph showing the characteristics of the shield sleeve 1. Example 2 indicated by a reference numeral A2 and Example 3 indicated by a reference numeral A3 in the embodiment shown in FIG. 3 refers to the shield sleeve 1 that is obtained by bundling polyarylate fiber (440 dtex), on which tin and copper are plated at a predetermined thickness and performing a braiding processing using twenty-four bundles. Further, in the case of Example 2 in the embodiment shown in FIG. 3, the braid density is 85% and the resistance between the braids is 0.096 Ω/m. Further, in the case of Example 3, the braid density is 97% and the resistance between the braids is 0.052 Ω/m. In the embodiment shown in FIG. 3, the horizontal axis represents the measurement frequency F [Hz] and the vertical axis represents the shielding effect S [dB].

Furthermore, Comparative Example 2 indicated by a reference numeral B2 in the embodiment shown in FIG. 3 refers to a tin-plated copper foil wrapping glass fiber sleeve in which the braid density is 65% and the resistance between the braids is 0.130 Ω/m.

As shown in FIG. 3, in all of Examples 2 and 3 and Comparative Example 2, the shielding effect of 20 dB or more can be obtained in the frequency band of 9 kHz to 1 GHz. However, Examples 2 and 3 have the shielding effects lager than Comparative Example 2. Therefore, when the braid density of braid is 85% or more and the resistance between the braids is 0.096 Ω/m or less, it is possible to secure a shielding effect equal to or more than a conventional shield sleeve generally used, by an absorbing clamp method.

Figure 4:
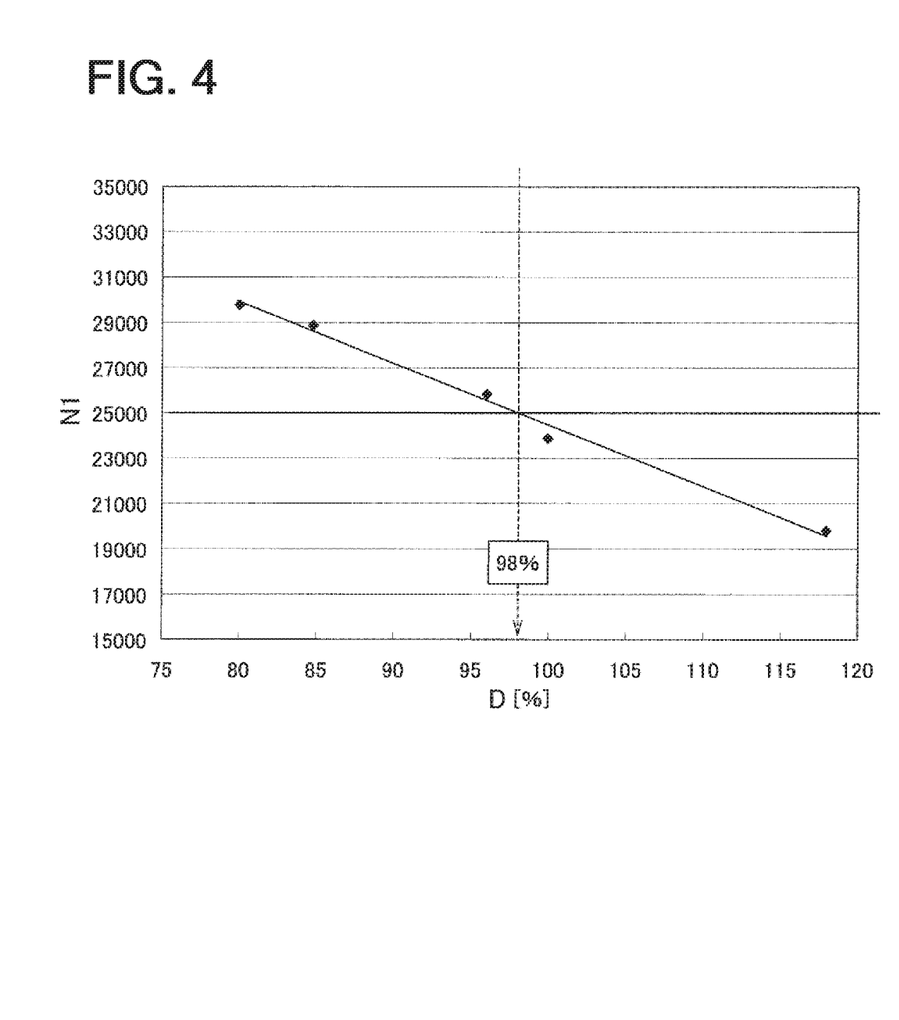
FIG. 4 is a graph showing a bending resistance of the shield sleeve.

FIG. 4 is a graph showing a bending resistance of the shield sleeve 1. In the measurements of FIG. 4, in a case where the shield sleeve 1 is provided along a guide of R20, a load of 400 g is applied, a distance between a fixed side and a moving side is set as 40 mm, a stroke is set as 100 mm and a cycle rate is set as 100 times/min, the number of times is counted when the resistance value between the braids rises by 10%. In the embodiment shown in FIG. 4, the horizontal axis represents the braid density D [%] and the vertical axis represents the sliding bending times N1.

In this measurement, the bending times N1 is 30000 times when the braid density D of the shield sleeve 1 is set as 80%. Further, the bending times N1 is 29000 times when the braid density D of the shield sleeve 1 is set as 85%. The bending times N1 is 26000 times when the braid density D of the shield sleeve 1 is set as 96%. Further, the bending times N1 is 24000 times when the braid density D of the shield sleeve 1 is set as 100%. The bending times N1 is 20000 times when the braid density D of the shield sleeve 1 is set as 118%.

In this case, the braid density of the shield sleeve 1 is required to be 98% or less in order to secure the bending times of 25000 times. By setting the braid density to be 98% or less, it is possible to provide a shield sleeve having an excellent bending resistance.

Further, the shield sleeve 1 of Example 2 has a thickness of 0.3 mm. On the contrary, the shield sleeve of Comparative Example 2 has a thickness of 0.6 mm. In addition, in the case of measuring the number of times when the full wear is caused, by inserting a copper rod of φ6 into the shield sleeve 1 and applying a ceramic ball of φ10 to the shield sleeve 1 with a load of 1 kg, the number of times in the shield sleeve 1 of Example 2 is 10000 times or more. On the contrary, in the shield sleeve of Comparative Example 2, the number of times is 1500 times.

Further, in a case where the bending test shown in FIG. 4 is performed on the shield sleeve 1 of Example 2, the conductor resistance is not changed even after the bending of 10000 times is performed. On the contrary, in the case of the shield sleeve of Comparative Examples, the conductor resistance is increased in the bending less than 3000 times.

As described above, according to the shield sleeve 1 of the present embodiment, the wear resistance and bending resistance are excellent since the tensile strength fibers 30 subjected to metal plating 40 and having an approximately circular section are used. Further, since the shield sleeve does not employ a configuration in which the metallic foil is wrapped around the surface of the yarn, the thickness thereof is not increased than necessary. Furthermore, since the braid density of braid is 85% or more and the resistance between the braids is 0.096 Ω/m or less, it is possible to secure a shielding effect equal to or more than a conventional shield sleeve generally used, by an absorbing clamp method. In addition, since the braid density of braid is 98% or less, it is possible to provide a shield sleeve 1 having an excellent bending resistance. Accordingly, it is possible to provide a shield sleeve 1 which is capable of obtaining the diameter reduction and high shielding effects while maintaining a high flexibility and high wear resistance.

Further, since the shield sleeve is multi-layered in a radial direction of an electric wire, it is possible to further improve a wear resistance and shielding effect.

Hereinabove, although the present invention has been described on the basis of the illustrative embodiments, the present invention is not limited to the above illustrative embodiments but may be modified without departing from the scope of the present invention.

For example, an electric wire shielded by the shield sleeve 1 according to the present embodiment is not limited to those shown in FIG. 1. Specifically, the conductor 10 may be not a single wire but a stranded wire or the like and can be appropriately modified.

Furthermore, although an example where a plating processing is performed on a bundle of a plurality of tensile strength fibers 30 when making the shield sleeve 1 to be multilayered has been described, the present invention is not limited to this configuration. The shield sleeve 1 may be multilayered by braiding a single tensile strength fiber 30 in a multiplayer, as shown in FIG. 2A or the shield sleeve 1 may be multilayered by braiding a plurality of tensile strength fibers 30 arranged on a plane into a multilayer, as shown in FIG. 2C. Furthermore, the shield sleeve may be braided and multilayered so that an arranging direction of a plurality of tensile strength fibers 30 arranged on a plane as shown in FIG. 2C coincides with a radial direction of an electric wire.

Although the present invention has been described in detail with reference to the particular embodiments, it is obvious to those skilled in the art that the particular embodiments can be variously modified and changed without departing a spirit and a scope of the present invention.

INDUSTRIAL APPLICABILITY

According to the present invention, it is possible to provide a shield sleeve capable of obtaining an excellent wear resistance and a bending resistance.

REFERENCE NUMERALS LIST

1: Shield sleeve
10: Conductor
20: Insulator
30: Tensile strength fiber
40: Metal plating

What is claimed is:

1. A manufacturing method for a shield sleeve comprising:
    applying plating pretreatment to a bundle of one or a plurality of tensile strength fibers, each of the plurality of tensile strength fibers having an approximately circular section;
    applying metal plating to the bundle of one or a plurality of tensile strength fibers to which the plating pretreatment is applied; and
    braiding the bundle of one or a plurality of tensile strength fibers to which metal plating is applied,
    wherein the plating pretreatment includes a first process of applying an oil agent which can dissolve and reduce organo-metallic complex to the one or a plurality of tensile strength fibers, and a second process of contacting a supercritical carbon dioxide to the one or a plurality of tensile strength fibers to which the oil agent is applied in the first step in a state that the organo-metallic complex is charged.

* * * * *